United States Patent
Tanaka et al.

(10) Patent No.: US 9,142,703 B2
(45) Date of Patent: Sep. 22, 2015

(54) METHOD OF MANUFACTURING PHOTOELECTRIC CONVERSION DEVICE, AND METHOD OF MANUFACTURING IMAGE DISPLAY

(71) Applicant: SEIKO EPSON CORPORATION, Tokyo (JP)

(72) Inventors: Hideki Tanaka, Chino (JP); Ichio Yudasaka, Chino (JP); Masahiro Furusawa, Chino (JP); Tsutomu Miyamoto, Shiojiri (JP); Tatsuya Shimoda, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/227,507

(22) Filed: Mar. 27, 2014

(65) Prior Publication Data

US 2014/0212999 A1    Jul. 31, 2014

Related U.S. Application Data

(62) Division of application No. 11/364,000, filed on Mar. 1, 2006, now Pat. No. 8,723,015.

(30) Foreign Application Priority Data

Mar. 28, 2005    (JP) .................................. 2005-092494

(51) Int. Cl.
| | |
|---|---|
| *H01L 31/12* | (2006.01) |
| *H01L 31/0216* | (2014.01) |
| *H01L 31/0392* | (2006.01) |
| *H01L 31/20* | (2006.01) |
| *H01L 31/075* | (2012.01) |
| *H01L 31/046* | (2014.01) |

(52) U.S. Cl.
CPC ........ *H01L 31/125* (2013.01); *H01L 31/02167* (2013.01); *H01L 31/03921* (2013.01); *H01L 31/046* (2014.12); *H01L 31/075* (2013.01); *H01L 31/202* (2013.01); *Y02E 10/50* (2013.01)

(58) Field of Classification Search
CPC ................... H01L 31/02167; H01L 31/03921; H01L 31/125; H01L 31/046; H01L 31/075; H01L 31/022425; H01L 31/042; H01L 31/05; H01L 31/02168; Y02E 10/50
See application file for complete search history.

(56) References Cited

U.S. PATENT DOCUMENTS

| | | | |
|---|---|---|---|
| 4,378,460 | A | 3/1983 | Williams |
| 5,595,607 | A | 1/1997 | Wenham et al. |
| 5,807,440 | A | 9/1998 | Kubota et al. |
| 6,171,905 | B1 | 1/2001 | Morita et al. |
| 6,518,087 | B1 | 2/2003 | Furusawa et al. |
| 7,227,078 | B2 | 6/2007 | Jongerden et al. |
| 2002/0050286 | A1 | 5/2002 | Kubota |

FOREIGN PATENT DOCUMENTS

| | | |
|---|---|---|
| JP | U-57-168251 | 10/1982 |
| JP | A-8-088383 | 4/1996 |
| JP | A-10-308525 | 11/1998 |
| JP | A-2002-343998 | 11/2002 |
| JP | A-2004-228450 | 8/2004 |
| WO | WO 00/59044 | 10/2000 |

*Primary Examiner* — Xiuyu Tai
(74) *Attorney, Agent, or Firm* — Oliff PLC

(57) ABSTRACT

A photoelectric conversion device includes a plurality of photoelectric conversion regions disposed over a substrate, and a colored region disposed among the photoelectric conversion regions over the substrate, the colored region forming an image over the substrate.

4 Claims, 6 Drawing Sheets

US 9,142,703 B2

METHOD OF MANUFACTURING PHOTOELECTRIC CONVERSION DEVICE, AND METHOD OF MANUFACTURING IMAGE DISPLAY

This is a Division of application Ser. No. 11/364,000 filed Mar. 1, 2006, which claims the benefit of Japanese Patent Application No. 2005.092494 filed Mar. 28, 2005. The disclosure of the prior applications is hereby incorporated by reference herein in its entirety.

BACKGROUND OF THE INVENTION

1. Technical Field

The present invention relates to a photoelectric conversion device that is manufactured by using a liquid containing a silicon compound, an image display, a method of manufacturing a photoelectric conversion device, and a method of manufacturing an image display.

2. Related Art

Photoelectric conversion devices typified by solar cells have attracted increasing attention as an environmentally friendly power supply. Single-crystal silicon solar cells, which are used for e.g. a power supply for an artificial satellite, and solar cells employing polycrystalline silicon or amorphous silicon have been widely used for industrial use and home use.

Typically an amorphous silicon solar cell has a so-called PIN structure in which a light-absorbing layer composed of an intrinsic-type (I-type) semiconductor layer is interposed between a P-type semiconductor layer and an N-type semiconductor layer. The amorphous silicon solar cell utilizes a built-in electric field arising in the I-semiconductor layer to thereby extract the photocurrent and photovoltage from the electrode.

International Patent Publication WO00/59044, which is a first example of the related-art documents, has proposed a method for manufacturing a solar cell at low costs without using large-scale equipment. In the method, a liquid coating composition containing a silicon compound is applied over a substrate to form a coating film, and then the coating film is converted into a silicon film by heat treatment and/or optical treatment. The silicon film is used as a semiconductor layer.

In step with widening of application range of solar cells, needs for characters and graphics to be represented as design on the solar cell part have been increasing. For example, there are needs for a face photograph, name and so on to be represented on an IC card of which entire body is formed of a solar cell.

Some related-art documents disclose methods for representing characters and graphics on a solar cell part. For example, JP-A-10-308525, which is a second example of the related-art documents, discloses a method in which solar cell panels are arranged so that a two-dimensional representation pattern is formed in a mosaic manner.

Furthermore, JP-A-8-88383, which is a third example of the related-art documents, discloses a method in which the contour shape of a transparent film on the surface of a solar cell is partially varied to form characters and picture patterns on the surface.

In addition, JP-A-2004-228450, which is a fourth example of the related-art documents, discloses a method in which electrodes, semiconductor layers, and a colorant layer are formed into a shape of graphics and the like to be represented.

The methods of the second to fourth examples however cannot allow representation of minute graphics and high-definition photographs. Moreover, it is difficult in terms of costs to apply these methods to fabrication of products such as ID cards, which are fabricated on a high-mix/low-volume production basis.

SUMMARY

An advantage of some aspects of the invention is to provide a photoelectric conversion device provided with high-definition images, and a manufacturing method thereof.

A photoelectric conversion device according to a first aspect of the invention includes a plurality of photoelectric conversion regions disposed over a substrate, and a colored region disposed among the photoelectric conversion regions over the substrate. The colored region forms an image over the substrate.

The first aspect allows the same surface to have both a representation function and a photoelectric conversion function, which can enhance the use efficiency of the device surface.

It is preferable that the number of photoelectric conversion regions per unit area is substantially uniform across the entire substrate. This region number uniformity allows the performance of the photoelectric conversion device to be uniform across the entire substrate.

In addition, it is preferable that the number of colored regions per unit area is also substantially uniform across the entire substrate.

Furthermore, it is preferable that the area ratio B/A between the photoelectric conversion regions A and the colored regions B is equal to or larger than 1. Such an area ratio allows formation of high-definition images.

The images encompass e.g. characters, photographs, and symbol marks.

A photoelectric conversion device according to a second aspect of the invention includes a first electrode formed on a substrate, a first-conductivity-type semiconductor layer formed on the first electrode, a plurality of intrinsic-type (I-type) semiconductor films formed on the first-conductivity-type semiconductor layer, a second-conductivity-type semiconductor layer formed on the plurality of I-type semiconductor films, and a second electrode formed on the second-conductivity-type semiconductor layer. The plurality of I-type semiconductor films are formed into an island shape with a gap being ensured among the I-type semiconductor films. A colorant is disposed on a region that does not overlap with the plurality of I-type semiconductor films. An image that includes the colorant as a component thereof is formed. The colorant may be formed on the second electrode. Alternatively, the colorant may be formed on a region that exists between the first-conductivity-type semiconductor layer and the second-conductivity-type semiconductor layer, and does not have the I-type semiconductor film thereon.

The second aspect allows the same surface to have both a representation function and a photoelectric conversion function, which can enhance the use efficiency of the device surface.

Moreover, when an insulating film is formed on the regions that exist between the first-conductivity-type semiconductor layer and the second-conductivity-type semiconductor layer, and do not have the I-type semiconductor film thereon, short-circuit between the first-conductivity-type and second-conductivity-type semiconductor layers via the region on which the I-type semiconductor film is not formed can be prevented. Instead of an insulating film, a semiconductor film having a thickness smaller than that of the I-type semiconductor film may be formed.

In addition, in the photoelectric conversion device according to the second aspect, a region, on the second-conductivity-type semiconductor layer, that does not overlap with the colorant and the colorant are preferably used as a component that forms the image.

Thus, such image processing is allowed that the region, on the second-conductivity-type semiconductor layer, that does not overlap with the colorant is also used as another colorant. Therefore, the quality of the image can be enhanced.

An image display according to one embodiment of the invention includes the above-described photoelectric conversion device.

Thus, high-definition images can be formed on the image display, and thus the functionalities and aesthetic properties of the image display can be enhanced. In addition, supply of drive power to an information display unit or the like incorporated in the image display is allowed. The term image display encompasses IC cards, photographs, posters, cellular phones and signboards that are provided with a photoelectric conversion device. In addition, the image display also encompasses overall equipment having a decorative surface thereon, such as automobiles and airplanes. Furthermore, the image display also encompasses real-estate properties, such as wall surfaces of buildings.

A method of manufacturing a photoelectric conversion device according to a third aspect of the invention includes forming a first-conductivity-type semiconductor layer on a substrate, disposing a plurality of liquid materials on the first-conductivity-type semiconductor layer so that a gap is ensured among the liquid materials, and baking the plurality of liquid materials to form a plurality of intrinsic-type (I-type) semiconductor films. The method also includes forming a second-conductivity-type semiconductor layer on the plurality of I-type semiconductor films, and disposing a colorant on a region that does not overlap with the plurality of I-type semiconductor films. The colorant is a component that forms an image.

The third aspect allows the same surface to have both a representation function and a photoelectric conversion function, which can enhance the use efficiency of the device surface.

The plurality of liquid materials and the colorant are preferably discharged from a nozzle of an ink jet device. Thus, the I-type semiconductor films and the colorant can be disposed on a desired position.

Furthermore, the method according to the third aspect may further include prior to the disposing a plurality of liquid materials, determining arrangement of the plurality of liquid materials and the colorant based on image processing information.

The preliminary determination of components that form an image allows the plurality of liquid materials to be disposed on adequate places without significantly lowering the image quality.

In addition, a method of manufacturing an image display according to one embodiment of the invention employs the above-described method of manufacturing a photoelectric conversion device.

Thus, high-definition images can be formed on the image display, and thus the functionalities and aesthetic properties of the image display can be enhanced. In addition, supply of drive power to an information display unit or the like incorporated in the image display is allowed.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Embodiments of the invention will be described below with reference to the drawings.

First Embodiment

Figure 1:
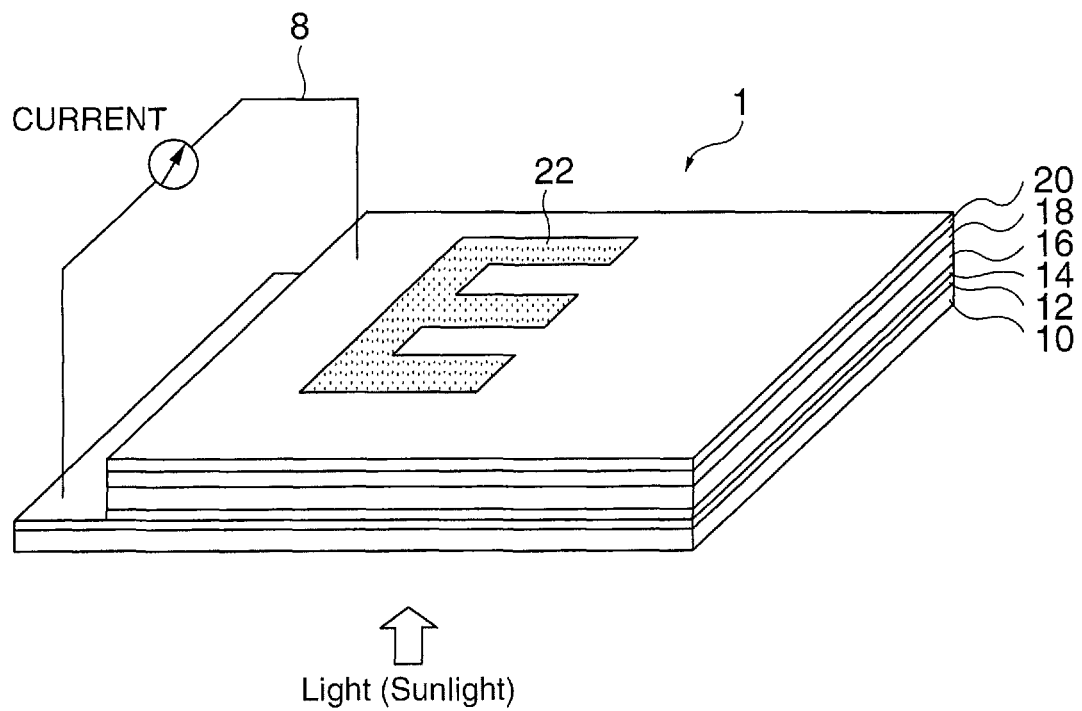
FIG. 1 is a perspective view illustrating a photoelectric conversion device according to one embodiment of the invention.

FIG. 1 is a perspective view illustrating a photoelectric conversion device 1 according to an embodiment of the invention. In the following description, the upper and lower sides of the drawing plane of FIG. 1 are defined as the upper and lower sides of the photoelectric conversion device 1, respectively. Therefore, the surfaces of each layer (each member) on the upper and lower sides of the drawing plane of FIG. 1 are referred to as an upper surface and a lower surface, respectively.

The photoelectric conversion device 1 shown in FIG. 1 is a so-called dry photoelectric conversion device, which requires no electrolyte solution. The photoelectric conversion device 1 includes a substrate 10, a first electrode (planar electrode) 12, a P-type semiconductor layer 14 as a first-conductivity-type semiconductor layer, an I-type semiconductor layer 16, an N-type semiconductor layer 18 as a second-conductivity-type semiconductor layer, and a second electrode (counter electrode) 20. On the upper surface of the second electrode 20, a colorant layer 22 (the dotted area in FIG. 1) forms a graphic. Coupling the first electrode 12 and the second electrode 20 via an external circuit 8 allows a current (photogenerated current) to flow through the external circuit 8. The structure of the layers (members) will be described below.

The substrate 10 supports thereover the first electrode 12, the P-type semiconductor layer 14, the I-type semiconductor layer 16, the N-type semiconductor layer 18, and the second electrode 20. The substrate 10 is made of a flat plate (or layer) member.

As shown in FIG. 1, the photoelectric conversion device 1 receives light such as sunlight (referred to simply as light, hereinafter) through the substrate 10 and the first electrode 12, so as to be put into use. Therefore, it is preferable that the substrate 10 and the first electrode 12 are substantially transparent (colorless transparent, color transparent or semi-transparent). The substrate 10 with transparency allows light to reach the I-type semiconductor layer 16 efficiently.

FIGS. 2A to 2G illustrate manufacturing steps for the photoelectric conversion device 1.

Step of Forming First Electrode

Figure 2A:
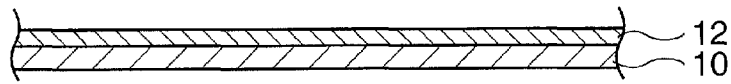
FIGS. 2A to 2G are explanatory diagrams illustrating manufacturing steps for a photoelectric conversion device according to one embodiment of the invention.

Referring initially to FIG. 2A, the first electrode 12 is formed on the substrate 10.

Examples of the material of the substrate 10 include various glass materials, various ceramic materials, and various resin materials such as polycarbonate (PC) and polyethylene terephthalate (PET). The substrate 10 may be formed of a single layer, or alternatively may be formed of a multi-layered body including plural layers.

The average thickness of the substrate 10 is not particularly limited but adequately set depending on its material, application and so on. The following thickness condition is available for example.

When the substrate 10 is composed of a hard material, the average thickness thereof is preferably about 0.1-1.5 mm, and is more preferably about 0.8-1.2 mm. When the substrate 10 is a flexible substrate (flexible substrate composed mainly of a resin material), the average thickness thereof is preferably about 0.5-150 µm, and is more preferably about 10-75 µm.

In the case of mounting the photoelectric conversion device 1 on any of various electronic apparatuses, a constructional member of the electronic apparatus can be used as the substrate 10 of the photoelectric conversion device 1.

The upper surface of the substrate 10 has thereon the layer first electrode (planar electrode) 12. Any of the following materials can be used for the first electrode 12: various metal oxides (transparent conductive oxides) such as indium tin oxide (ITO), tin oxide doped with fluorine (FTO), indium oxide (IO), and tin dioxide ($SnO_2$); various metal materials such as aluminum, nickel, cobalt, platinum, silver, gold, copper, molybdenum, titanium, tantalum, and an alloy including any of these metals; various carbon materials such as carbon, carbon nanotubes, and fullerenes; and so on. Of these materials, one kind or a combination of two or more kinds may be used. Use of sputtering, a spray method, an ink jet method or another deposition method allows formation of a thin-film electrode composed of any of these materials.

The average thickness of the first electrode 12 is not particularly limited but adequately set depending on its material, application and so on. The following thickness condition is available for example. When the first electrode 12 is composed of any of various metal oxides, the average thickness thereof is preferably about 0.05-5 µm, and is more preferably about 0.1-1.5 µm. When the first electrode 12 is composed of any of various metal materials and carbon materials, the average thickness thereof is preferably about 0.01-1 µm, and is more preferably about 0.03-0.1 µm.

Step of Forming P-type Semiconductor Layer

Figure 2B:
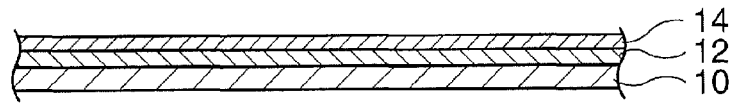

Referring next to FIG. 2B, formed on the first electrode 12 is the P-type semiconductor layer 14 as a first semiconductor layer.

The P-type semiconductor layer 14 can be formed by using a liquid material prepared through the following procedure. Specifically, a silicon compound of a general formula $Si_aX_bY_c$ is mixed with a silicon compound (a silane compound in particular) having a ringsystem and expressed by a general formula $Si_nX_m$. X denotes a hydrogen atom and/or a halogen atom. n denotes an integer larger than 4. m denotes an integer represented by any of n, 2n−2 and 2n. Subsequently, the mixture is irradiated with ultraviolet rays so as to be polymerized, and then is diluted with a solvent such as toluene, followed by being percolated through a filter. This solution is used as the liquid material. There is no particular limitation on the solvent as long as it dissolves the above-described silane compound and/or modified silane compound, and does not react with the solute. As a modified silane used for forming the P-type semiconductor layer, a silane compound including a boron atom is available for example.

The above-described liquid material can be applied on the first electrode 12 by using spin coating, roll coating, curtain coating, dip coating, a spray method, an ink jet method, or another coating method. The coating thickness is about several tens nanometers for example. After the coating, the coated material is baked at 400° C. for 1 hour for example, to thereby form doped amorphous silicon. The amorphous silicon may be crystallized by laser irradiation or the like according to need.

A specific example of a method of forming a P-type amorphous silicon film is as follows. Specifically, 1 mg of 1-borahexaprismane (Compound 1) as a boron modified silane compound and 1 g of cyclohexasilane are dissolved in 20 g of toluene to prepare a coating solution. The solution is spin-coated on the substrate 10 in an argon atmosphere. The coated solution is dried at 150° C., followed by being pyrolized at 450° C. in argon containing 3% of hydrogen, to thereby form a P-type amorphous silicon film having a thickness of about 60 nm.

Step of Forming Precursor Film of Silicon Film

Figure 2C:
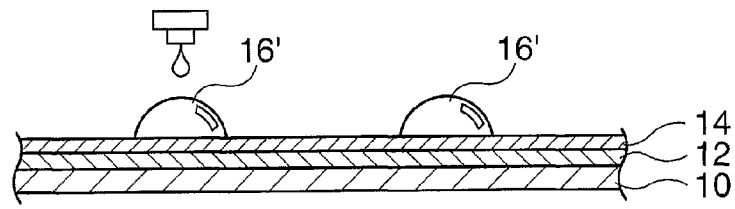
Figure 2D:
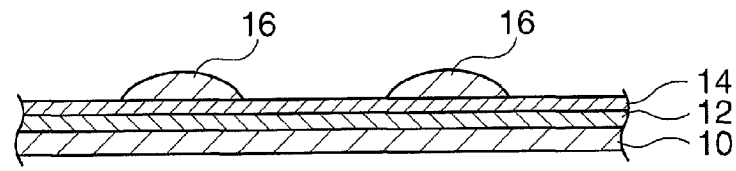

Referring next to FIG. 2C, a liquid silicon material containing no impurity is discharged by an ink jet method so that droplets are disposed on the P-type semiconductor layer 14. The discharged droplets are dried to form precursor films 16' of a silicon film.

As the liquid silicon material, a material prepared through the following procedure can be used. Specifically, a silicon compound (a silane compound in particular) having a ring-system and expressed by a general formula $Si_nX_m$ (X denotes a hydrogen atom and/or a halogen atom, n denotes an integer larger than 4, and m denotes an integer represented by any of n, 2n−2 and 2n) is irradiated with ultraviolet rays so as to be polymerized, and then is diluted with a toluene solvent to about 10%, followed by being percolated through a filter.

Figure 3:
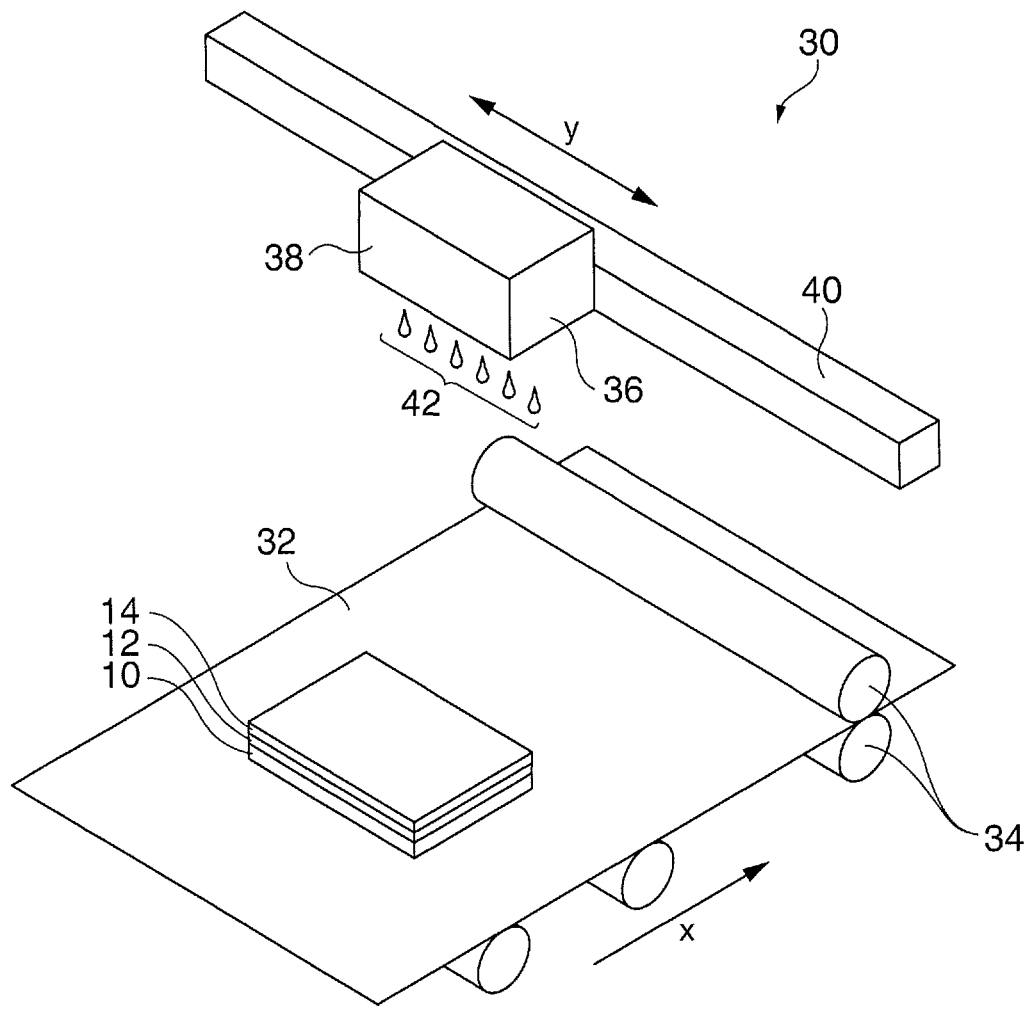
FIG. 3 is a diagram illustrating a droplet discharge device used in a method of manufacturing a photoelectric conversion device according to one embodiment of the invention.

FIG. 3 illustrates one example of a droplet discharge device (ink jet device) that is used for an ink jet method.

Referring to FIG. 3, a droplet discharge device 30 includes a table 32 on which the substrate 10 is placed, and an X-axis drive roller 34 for moving the table 32 in the X-axis direction (main scanning). The device 30 also includes a droplet discharge head 38 having nozzles 36, and a Y-axis drive mechanism 40 for moving the droplet discharge head 38 in the Y-axis direction (sub scanning).

A liquid silicon material is loaded in the droplet discharge head 38, and is discharged as droplets 42 from small orifices formed at end tips of the nozzles 36.

The discharging of the droplets 42 from the small orifices of the nozzles 36 is associated with movement of the table 32 in the X-axis direction and reciprocation of the droplet discharge head 38 in the Y-axis direction. Thus, the above-described film is formed.

The droplets 42 can be disposed over the substrate 10 based on calculation by the droplet discharge device based on information for processing a certain image. The certain image is an image (graphic) formed through a step of forming a colorant layer, to be described later.

Heat Treatment Step

Referring back to FIG. 2D, baking is carried out at 400° C. for 1 hour, and thus the precursor films 16' of a silicon film are converted into amorphous silicon films (I-type semiconductor layers) 16.

The film thickness decreases through the baking. In the method according to the embodiment, the droplets are formed to have a thickness of at least 1 µm, preferably at least 2 µm, and more preferably at least 3 µm.

In the heat treatment, typically an arrival temperature lower than about 550° C. offers an amorphous silicon film while a temperature above about 550° C. offers a polycrystalline silicon film. In order to obtain an amorphous silicon film, a temperature in the range of 300-550° C. is preferably used, and a temperature in the range of 350-500° C. is more preferably used. An arrival temperature lower than 300° C. cannot advance the pyrolysis of a silane compound sufficiently, and therefore fails to form a silicon film with sufficiently favorable characteristics in some cases. It is preferable that the atmosphere for the heat treatment is an inactive gas such as nitrogen, helium or argon, or a mixture of an inactive gas with a reducing gas such as hydrogen. If formation of a polycrystalline silicon film is intended, the obtained amorphous silicon film may be irradiated with a laser, to thereby be converted into a polycrystalline silicon film. It is preferable that the atmosphere for the laser irradiation is an inactive gas such as nitrogen, helium or argon, or a mixture of any of these inactive gases with a reducing gas such as hydrogen. That is, an atmosphere including no oxygen is preferable. Note that if laser irradiation employing an excimer laser or the like is implemented for discharged droplets instead of the heat treatment therefor, a polycrystalline silicon film can be achieved directly. It is obvious that the crystallization by laser irradiation may be carried out after the formation of an amorphous silicon film by baking.

Step of Forming Insulating Film

Figure 2E:
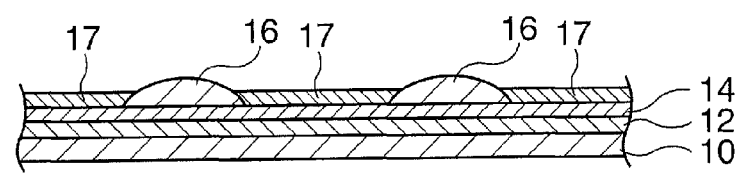

Referring next to FIG. 2E, gaps among the I-type semiconductor layers 16 deposited in an island shape are filled with an insulating film 17. The kind of the insulating film 17 is not particularly limited. For example, an $SiO_2$ film is available. Typical sputtering, CVD or another method can be used for the formation thereof. In the method of manufacturing a photoelectric conversion device according to the embodiment, the I-type semiconductor layers are formed by using a liquid material without requiring vacuum processes. Therefore, if a method of using a liquid material is employed in common to all other thin films, all the steps can be implemented in the same equipment and under the same environment. For example, the insulating film 17 can be formed by applying polysilazane only on regions among the islands by an ink jet method, and then the applied polysilazane is baked in an air atmosphere to thereby form an $SiO_2$ film. Alternatively, a liquid containing the above-described silicon compound may be applied, and then the applied liquid may be baked in an air atmosphere. It is preferable that the thickness of the insulating film 17 is in the range of about 200-500 nm.

The insulating film 17 can prevent the P-type semiconductor layer 14 from being brought into contact with an N-type semiconductor layer to be formed later.

Also when a semiconductor film having a thickness smaller than that of the I-type semiconductor layers 16 is formed in the gaps among the I-type semiconductor layers 16 instead of the insulating film 17, similar advantages can be achieved. The semiconductor film can be formed by a method similar to that for the I-type semiconductor layers 16, described referring to FIGS. 2C and 2D.

Step of Forming N-type Semiconductor Layer and Second Electrode

Figure 2F:
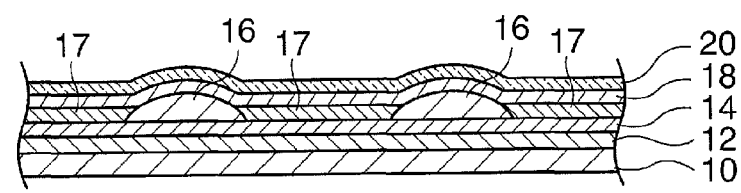

Referring next to FIG. 2F, the N-type semiconductor layer 18 and the second electrode 20 are formed.

The N-type semiconductor layer 18 can be formed by using, in the above-described method for forming the P-type semiconductor layer 14, a phosphorous modified silane compound instead of a boron modified silane.

Specifically, 1 mg of 1-phosphocyclopentasilane as a phosphorous modified silane compound and 1 g of octasilacubane (Compound 2) are dissolved in a mixture solvent of 10 g of toluene and tetrahydronaphthalene to prepare a coating solution. The solution is spin-coated in an argon atmosphere. Subsequently, the coated solution is dried at 150° C., followed by being pyrolized at 450° C. in argon containing 3% of hydrogen, and thus the N-type semiconductor layer 18 having a thickness of about 60 nm can be formed.

After the formation of the N-type semiconductor layer 18, an organic compound liquid material containing indium and tin is applied, and then heat treatment is carried out to convert the applied material into an ITO film. The ITO film is used as the second electrode 20.

Step of Forming Colorant Layer

Figure 2G:
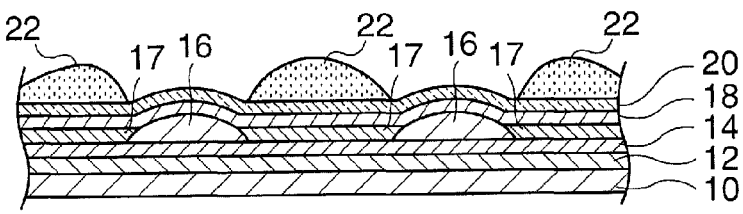

Referring next to FIG. 2G, the colorant layer 22 is formed on the second electrode 20 so that the colorant layer 22 represents a certain graphic shape. In order to form the colorant layer 22, a colorant is discharged by an ink jet method with using the droplet discharge device shown in FIG. 3, to thereby dispose colorant droplets. Here, the colorant is disposed so that the E-shape in FIG. 1 is formed.

Figure 4A:
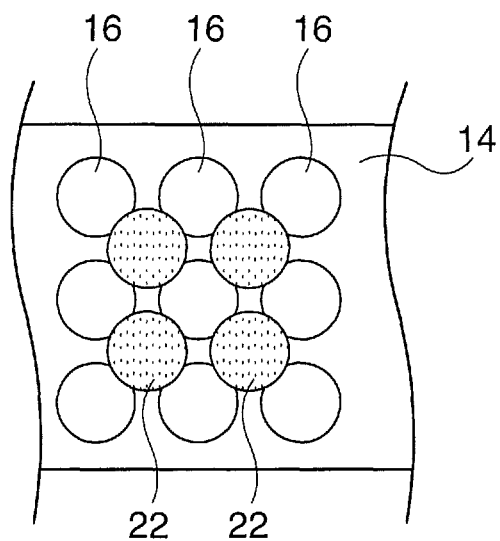
FIGS. 4A and 4B are plan views of a photoelectric conversion device according to one embodiment of the invention.

FIG. 4A is a plan view illustrating part of the photoelectric conversion device 1 in which the colorant layer 22 has been formed. As shown in the drawing, it is preferable that the colorant is disposed on the regions that do not overlap with the I-type semiconductor layers 16.

The colorant can be discharged from the droplet discharge device after the arrangement of the I-type semiconductor layers 16 and the colorant layer 22 is calculated so that the I-type semiconductor layers 16 and the colorant layer 22 form a certain image based on information for processing the certain image.

Figure 4B:
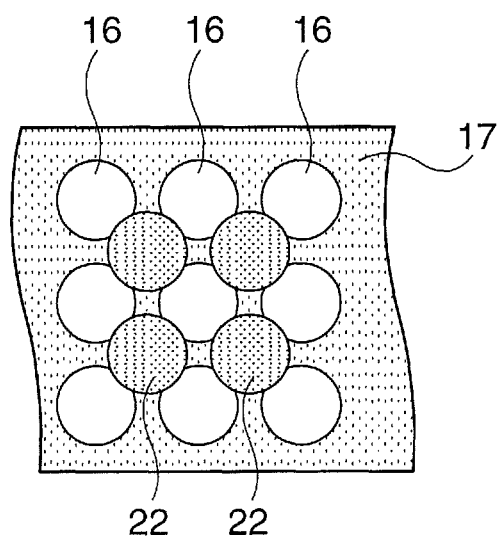

As shown in FIG. 4B, the colorant layer 22 may be disposed on the insulating film 17, i.e. on the regions that exist between the P-type semiconductor layer 14 and the N-type semiconductor layer 18, and do not overlap with the I-type semiconductor layers 16.

In the examples of FIGS. 4A and 4B, only the colorant layer 22 forms an image. Alternatively, not only the colorant layer 22 but also part, of the N-type semiconductor layer 18, that does not overlap with the colorant layer 22 may be used as a component of an image. By using part other than the colorant layer 22 as a component of an image, the quality of the image can further be enhanced.

As the colorant of the colorant layer 22, any of various pigments and various dyes can be formed alone or in combination. Pigments are superior in that they exhibit less aging degradation. Dyes are superior in that they have a higher adhesion to the second electrode 20.

As pigments, any of various organic pigments and various inorganic pigments can be used. Examples of the organic pigments include phthalocyanine pigments, azo pigments, anthraquinone pigments, azomethine pigments, quinophthalone pigments, isoindolinone pigments, nitroso pigments, perinone pigments, quinacridone pigments, perylene pigments, pyrrolopyrrole pigments, dioxazine pigments, and other pigments. Examples of the inorganic pigments include carbon pigments, chromate pigments, sulfide pigments, oxide pigments, hydroxide pigments, ferrocyanide pigments, silicate pigments, phosphate pigments, and other substances such as cadmium sulfide and cadmium selenide.

Furthermore, examples of dyes include metal complex dyes such as $RuL_2(SCN)_2$, $RuL_2Cl_2$, $RuL_2(CN)_2$, Ruthenium 535-bisTBA (produced by Solaronix Co.), and $[RuL_2(NCS)_2]2H_2O$, cyan dyes, xanthene dyes, azo dyes, hibiscus dyes, blackberry dyes, raspberry dyes, pomegranate dyes, and chlorophyll dyes. Note that L in the above composition formulas represents 2,2'-bipyridine or a derivative thereof.

Second Embodiment

In a second embodiment of the invention, after the N-type semiconductor layer 18 is formed, the colorant layer 22 is formed on the N-type semiconductor layer 18. FIGS. 5A to 5H illustrate manufacturing steps for a photoelectric conversion device 1 according to the second embodiment of the invention. The steps shown in FIGS. 5A to 5E are the same as those in the first embodiment.

Step of Forming N-type Semiconductor Layer

Figure 5A:
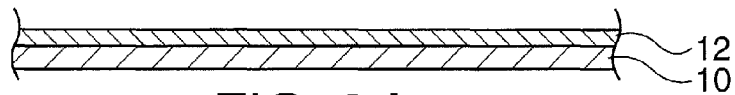
FIGS. 5A to 5H are explanatory diagrams illustrating manufacturing steps for a photoelectric conversion device according to a second embodiment of the invention.
Figure 5B:
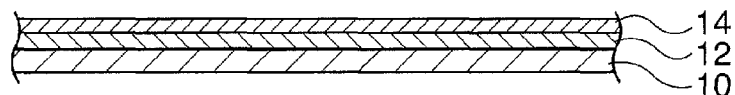
Figure 5C:
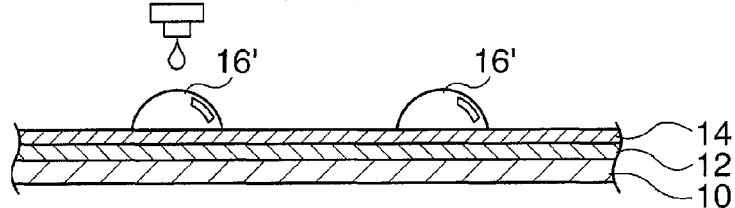
Figure 5D:
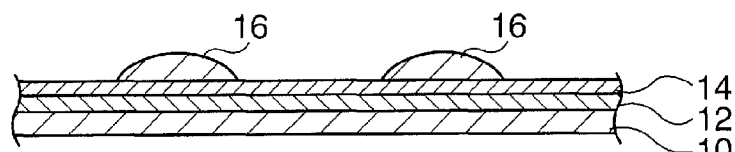
Figure 5E:
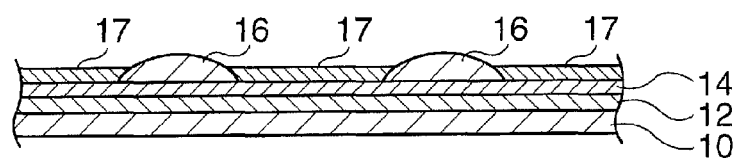
Figure 5F:
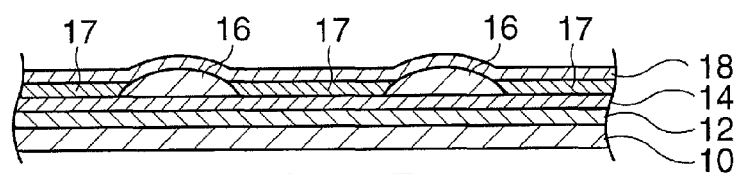

Referring to FIG. 5F, the N-type semiconductor layer 18 is formed. Similarly to the first embodiment, initially 1 mg of 1-phosphocyclopentasilane as a phosphorous modified silane compound and 1 g of octasilacubane (Compound 2) are dissolved in a mixture solvent of 10 g of toluene and tetrahydronaphthalene to prepare a coating solution. The solution is spin-coated in an argon atmosphere. Subsequently, the coated solution is dried at 150° C., followed by being pyrolized at 450° C. in argon containing 3% of hydrogen, and thus the N-type semiconductor layer 18 having a thickness of about 60 nm can be formed.

Step of Forming Colorant Layer

Figure 5G:
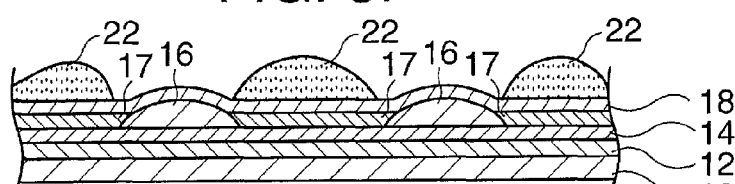

Referring next to FIG. 5G, the colorant layer 22 is formed on the N-type semiconductor layer 18 so that the colorant layer 22 represents a certain graphic shape. The colorant layer 22 is formed by discharging a colorant by an ink jet method similarly to the first embodiment.

Step of Forming Second Electrode

Figure 5H:
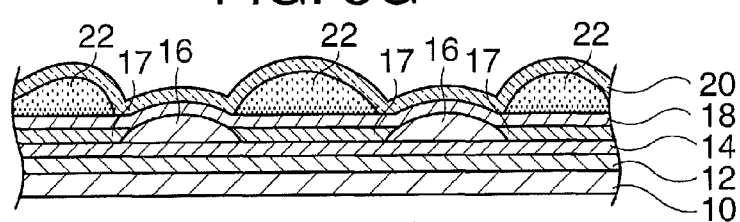

Referring next to FIG. 5H, an organic compound liquid material containing indium and tin is applied on the colorant layer 22, and then heat treatment is carried out to convert the applied material into an ITO film. The ITO film is used as the second electrode 20.

Image Display

An image display according to one embodiment of the invention includes any of the above-described photoelectric conversion devices 1.

Figure 6:
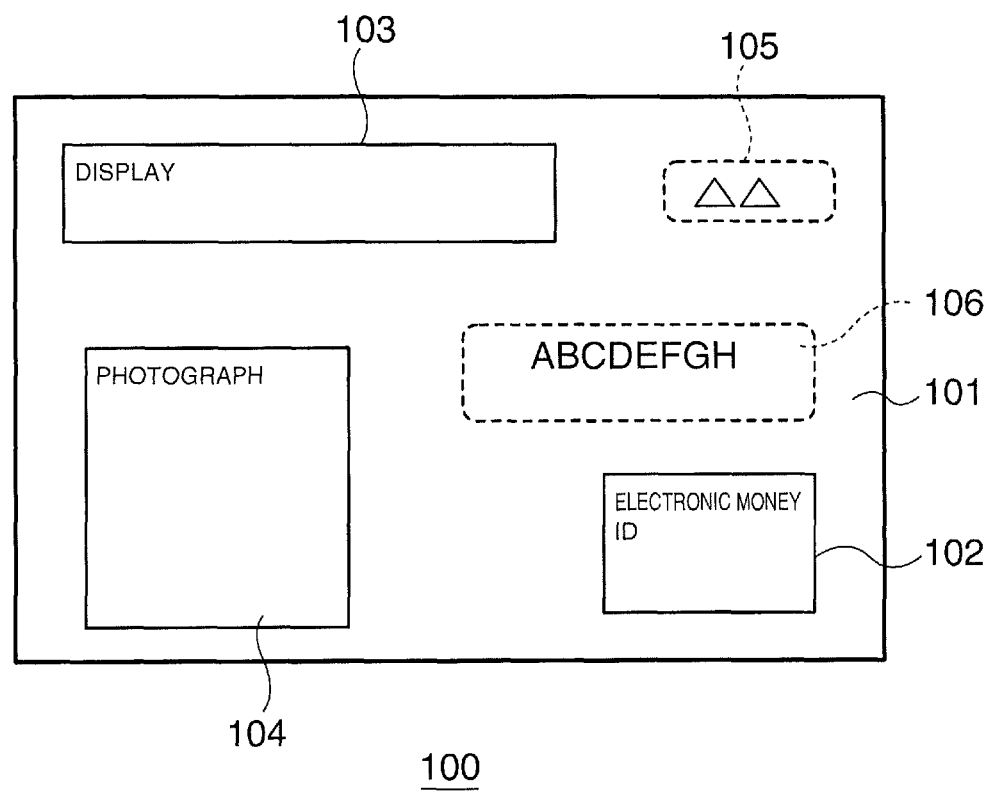
FIG. 6 is a diagram illustrating one example of a portable device according to one embodiment of the invention.

FIG. 6 is a plan view illustrating an IC card 100 to which an image display according to one embodiment of the invention is applied.

The IC card 100 is formed of a body 101 having a solar cell function, and includes on the body 101, an IC chip 102 storing information of electronic money and so on, and a display 103. A photograph 104, a logo mark 105, and characters 106 printed on the body 101 are formed on the solar cell by the method according to any of the embodiments of the invention.

As an image display according to one embodiment of the invention, besides the IC card shown in FIG. 6, e.g. photographs, signboards and so on having a solar cell function are available. In addition, buttons and keys included in an electronic apparatus such as a cellular phone and having a solar cell function are also available. Furthermore, the image displays according to the embodiment encompass overall equipment having a decorative surface thereon, such as automobiles and airplanes. The image displays also encompass real-estate properties, such as wall surfaces of buildings.

What is claimed is:

1. A method of manufacturing a photoelectric conversion device comprising:
    forming a first-conductivity-type semiconductor layer on a substrate;
    disposing a plurality of drops of liquid material on the first-conductivity-type semiconductor layer so that a gap is ensured between adjacent drops of liquid material;
    baking the plurality of drops of liquid material to form a plurality of intrinsic-type (I-type) semiconductor films with the gap between adjacent I-type semiconductor films;
    filling the gaps with either an insulating film or a semiconductor film having a thickness smaller than that of the I-type semiconductor films;
    forming a second-conductivity-type semiconductor layer on the plurality of I-type semiconductor films; and
    disposing a colorant on a region that does not overlap with the plurality of I-type semiconductor films, the colorant being a component that forms an image.

2. The method of manufacturing a photoelectric conversion device according to claim 1, wherein the plurality of drops of liquid material and the colorant are discharged from a nozzle of an ink jet device so as to be disposed.

3. The method of manufacturing a photoelectric conversion device according to claim 2, further comprising prior to the disposing the plurality of drops of liquid material:
    determining arrangement of the plurality of drops of liquid material and the colorant based on image processing information.

4. A method of manufacturing an image display, the method comprising the method of manufacturing a photoelectric conversion device according to claim 1.

* * * * *